United States Patent [19]
Jang et al.

[11] Patent Number: 6,043,133
[45] Date of Patent: Mar. 28, 2000

[54] METHOD OF PHOTO ALIGNMENT FOR SHALLOW TRENCH ISOLATION CHEMICAL-MECHANICAL POLISHING

[75] Inventors: Syun-Ming Jang, Hsin-Chu; Ying-Ho Chen, Taipei; Jui-Yu Chang; Chen-Hua Yu, both of Hsin-Chu, all of Taiwan

[73] Assignee: Taiwan Semiconductor Manufacturing Company, Ltd., Hsin-Chu, Taiwan

[21] Appl. No.: 09/121,708

[22] Filed: Jul. 24, 1998

[51] Int. Cl.$^7$ ........................................ H01L 21/76
[52] U.S. Cl. ............................. 438/401; 438/424
[58] Field of Search ......................... 438/401, 424

[56] References Cited

U.S. PATENT DOCUMENTS

| | | | |
|---|---|---|---|
| 3,783,044 | 1/1974 | Cheskis et al. | 438/401 |
| 5,128,283 | 7/1992 | Tanaka | 437/228 |
| 5,316,966 | 5/1994 | Van Der Plas et al. | 438/401 |
| 5,356,513 | 10/1994 | Burke et al. | 156/636 |
| 5,578,519 | 11/1996 | Cho | 438/401 |
| 5,627,110 | 5/1997 | Lee et al. | 438/692 |
| 5,877,562 | 3/1999 | Sur et al. | 438/401 |
| 5,889,335 | 3/1999 | Kuroi et al. | 438/401 |
| 5,893,744 | 4/1999 | Wang | 438/401 |
| 5,911,108 | 6/1999 | Yen | 438/401 |
| 5,946,583 | 8/1999 | Wu | 438/401 |
| 5,950,093 | 9/1999 | Wei | 438/401 |
| 5,982,044 | 11/1999 | Lin et al. | 438/401 |

OTHER PUBLICATIONS

Wolf et al, "Silicon Processing For The VLSI Era–vol. I", Lattice Press, Sunset Beach, CA, 1986, p. 418–423, 477.

*Primary Examiner*—Olik Chaudhuri
*Assistant Examiner*—Anh Duy Mai
*Attorney, Agent, or Firm*—George O. Saile; Stephen B. Ackerman; William J. Stoffel

[57] ABSTRACT

The present invention provides a method of removing an shallow trench isolation (STI) oxide layer 38 from over alignment marks 30. The invention has two major features: (1) A STI photoresist mask 42A that is used to etch Alignment area trenches 34 around alignment marks 30 and to etch STI trenches 35 in device areas 14; and (2) A "reverse tone" STI photoresist mask 42B that is used to remove the isolation oxide 38 from over the alignment marks 30 and from over the active areas 37. The method begins by providing a substrate 10 having a device area 14, an alignment mark trench area 16; and an alignment mark area 18. A polish stop layer 20 22 is formed over the substrate 10. A trench isolation resist layer 42A is used to etch alignment area trenches 34 around the alignment marks 34 and STI trenches 35 in the device areas. A dielectric layer 38 is formed over the substrate. In a key step, the reverse tone trench isolation resist layer 42B is used to etch the first dielectric layer 38 from over the alignment marks 30 and the Active areas 27. Next, the remaining first dielectric layer 38 is chemical-mechanical polished thereby planarizing the first dielectric layer 38.

14 Claims, 6 Drawing Sheets

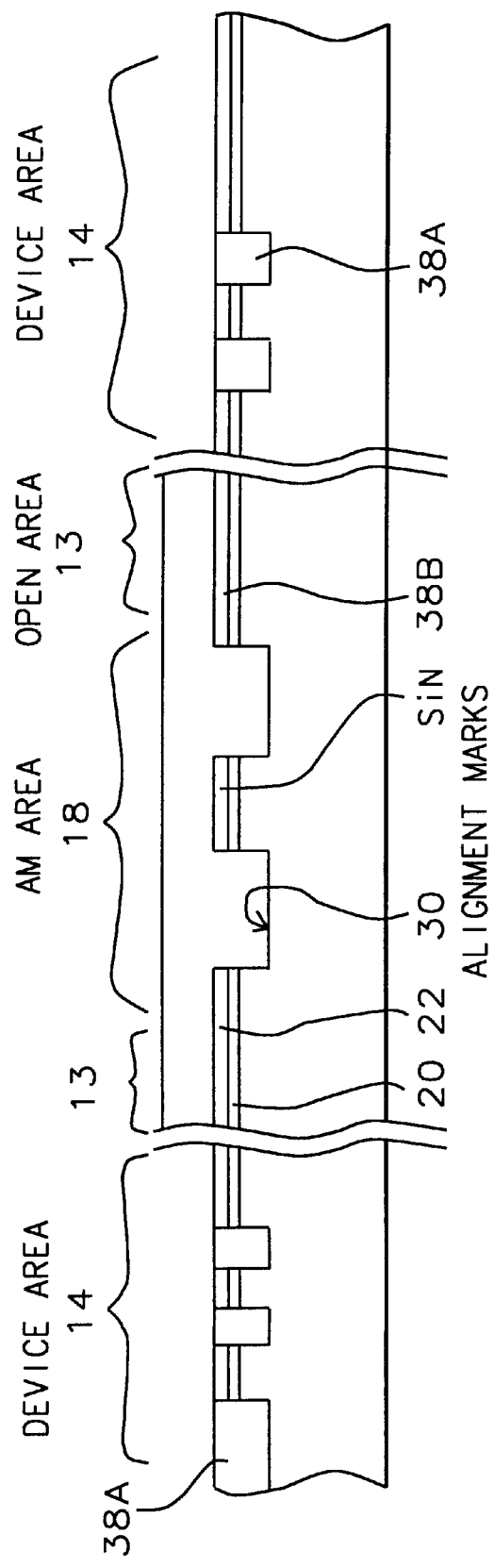
FIG. 1 – Prior Art

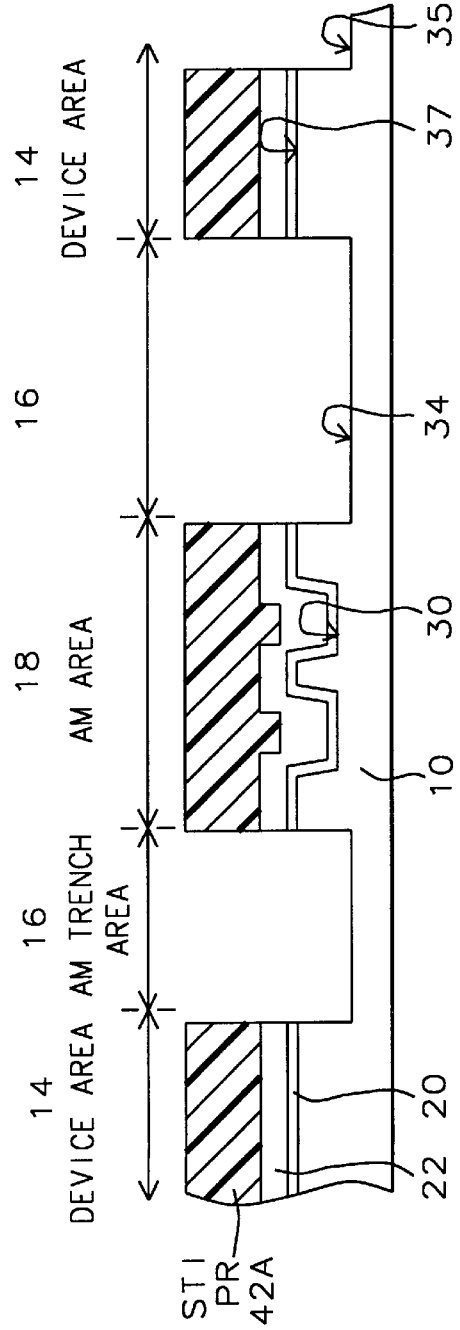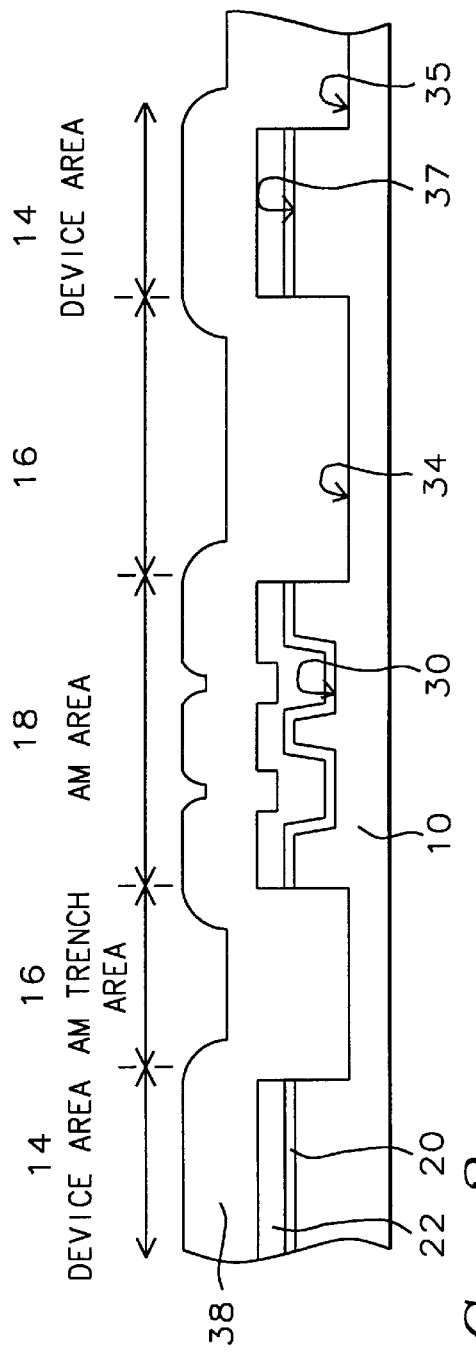

METHOD OF PHOTO ALIGNMENT FOR SHALLOW TRENCH ISOLATION CHEMICAL-MECHANICAL POLISHING

This application is related to U.S. Pat. No. 5,786,260, titled: "A Readable Alignment Mark Structure Formed Using Enhanced Chemical Mechanical Polishing".

BACKGROUND OF INVENTION

1) Field of the Invention

This invention relates generally to the structure and fabrication of alignment marks on semiconductor chips and particularly to the fabrication of alignment marks in a semiconductor process using trench isolation (STI) and chemical mechanical polishing (CMP). The invention provides a process for removing oxide, which is used to fill isolation trenches, from over alignment marks and from over active areas.

2) Description of the Prior Art

The fabrication of microcircuit devices on a semiconductor wafer involves a number of steps where patterns are transferred from photolithographic masks on the wafer. The masking step includes an etching step and defines selected areas to be exposed on the wafer for subsequent processes such as oxidation, metal deposition and impurity introduction.

In the production of integrate circuit structures, it has become increasingly important to provide structures having a plurality of metallization layers due the ever increasing density of the circuit elements in the structure. Further, as the device and feature sizes becoming smaller, it is important that the photolithographic mask be aligned precisely with the wafer during the masking step to minimize the misalignment between the layers. Most alignment schemes require the use of alignment targets that were defined on the wafers in the previous layer. One such scheme involves the use of two alignment targets that were defined on the wafer subsequent layers being aligned with respect to these two alignment targets. Typically, each alignment target comprises topographical marks which can be formed by etching into the wafer a plurality of steps with a height of, for example 1200Å. The alignment targets are used to diffract a laser alignment beam generated by a photolithography machine, commonly known as a wafer stepper, during the masking process. The diffraction pattern is received by the wafer stepper and the relative position of the wafer and the photolithographic mask is adjusted accordingly so that the pattern for the photolithographic mask are transferred to the wafer in the precise location as desired.

However, to meet the demand for more metal and insulating layers in devices and the stringent depth of focus requirement for submicron lithography, a new planarization technique, commonly known as chemical-mechanical polishing (CMP) is used. Typically, CMP planarization of the wafer involves holding the wafer against a rotating polishing pad wet with a silica-based alkaline slurry and at the same time applying pressure. Unlike the conventional planarization techniques, the CMP planarization technique provides a global planarization, that is, one that provides a large planarization range the generally covers the whole wafer surface. Since the planarization range is large, the steps of the alignment targets on a new overlying layer on the wafer will be flattened after it is planarized by a the CMP technique. The steps of the alignment targets on the previous layer are not replicated to the overlying layer. The overlying layer will cause alignment target reading problems by interfering with the diffraction pattern, especially where the overlying layer is a thick oxide or a nitride layer. The problem is even worse with when the newly formed overlying layer is highly reflective or opaque.

New isolation processes, such as shallow trench isolation (STI) create a thick oxide layer over the alignment marks and create the readability problems described above. In the STI process, a silicon nitride layer is formed on a wafer and patterned to have openings where trenches will be formed. Trenches are etched in the substrate. A thick oxide layer is deposited in the trenches and over wafer surface. Next, the thick oxide layer is polished (CMP) to create a planar surface.

As shown in FIG. 1, the inventor has found that the inventor's CMP process leaves a thick oxide layer 38B over the alignment marks 30 that interferes with a alignment mark reader, such as on an ASM stepper. FIG. 1 is a cross sectional view taken after a CMP process. The Conventional alignment marks (e.g., grooves or channels) 30 in an alignment mark (AM) area 18 have the thick insulating layer 38B (over the nitride layer 22 and pad oxide layer 20). A pad oxide layer 20 and a barrier layer 32 are formed over the substrate 10. As can be seen, after the CMP, the insulating layer 38B covers the alignment marks 30 and does not replicate the alignment mark topography. The oxide 38B over the alignment mark area 18 is thicker than the oxide layer 38A over the device areas 14 because the open areas 13 between the device area and the alignment marks do not have any pattern (smooth topology with no trenches). The inventor has found that the oxide 38B can be between 2000 and 4000 Å thicker than the oxide 39A over the device area even after chemical-mechanical polishing.

A non-optimum alternative is to over polish the wafer, thus removing most of the thick oxide over the alignment marks, but at the same time the over polishing removes oxide from the trenches, thus creating isolation and yield problems.

Other practitioners have proposed solutions to the non-readable alignment mark problem. U.S. Pat. No. 5,627,100 (Lee) shows a method for eliminating the window mask process when using a CMP process. U.S. Pat. No. 5,128,283 (Tanaka) shows a method of forming mask alignment marks. U.S. Pat. No. 5,356,513 (Burke) shows a method of forming a polished stop planarization using chemical-mechanical polishing (CMP). However, these methods can be improved over to provide a simpler process and further improve the readability of the alignment marks.

SUMMARY OF THE INVENTION

It is an object of the present invention to provide a structure and method for providing a readable alignment marks during processing.

It is an object of the present invention to provide a method for removing oxide layers 38B over an alignment mark area 18 using a "reverse tone" trench isolation resist layer 42B to etch the oxide 38B over the alignment marks 30 before a chemical-mechanical polish (CMP) process.

It is an object of the present invention to provide a method for forming shallow trench isolation on a wafer while removing the insulating layer over alignment mark area without using an extra photoresist/etch process.

It is an object of the present invention to provide a method for removing layers over an alignment mark area by forming an Alignment area trench 34 around the alignment marks 30 using the same mask used to form STI trenches in devices. A subsequent chemical-mechanical polish (CMP) process involves a locally enhanced polishing of the alignment mark area because of the Alignment area trench 34.

Another objective is to use a "reverse tone" STI mask 42B to remove oxide over active areas 37 and over alignment marks 30 to improve a subsequent chemical-mechanical polishing process.

To accomplish the above objectives, the present invention provides a method for removing a dielectric layer 20 22 from over alignment marks 30. The invention has two main elements:

(1) A STI photoresist mask 42A that is used to etch (a) Alignment area trenches 34 around alignment marks 30 and to etch (b) STI trenches 35 in device areas 14. (See FIG. 2C). The alignment area trenches 34 prevent over polishing of the alignment marks 30.

(2) A "reverse tone" STI photoresist mask 42B (See FIG. 4) that is used to remove the isolation oxide 38B from over the alignment mark 30 and from over the active areas 37. This removes all the oxide from over the alignment marks 30 making the alignment mark readable. This also improves the CMP planarization of the STI oxide 38A.

The method preferably comprises the steps of:

a) FIG. 2c—providing a substrate 10 having a device area 14 adjacent to a alignment mark trench area 16; the alignment mark trench area 16 is adjacent to and surrounding an alignment mark area 18; the alignment mark area 18 having alignment marks 30; the device area 14 having active areas 37 and STI areas 35;

b) forming a polish stop layer 20 22 over the substrate 10;

c) forming a trench isolation resist layer 42A covering at least the alignment mark trench area 16 and portions (isolation areas) of the device area 14 over the substrate 10;

d) Key element ①—FIG. 2c—using the trench isolation resist layer 42A as an etch mask, etching the polish stop layer 20 22 and the substrate 10 forming alignment area trenches 34 around the alignment marks 30, and forming STI trenches 35 in the devise areas 14;

e) FIG. 3—forming a dielectric layer 38 (e.g., isolation oxide) over the substrate and the polish stop layer 20 22;

f) Key element ④—FIG. 4—forming a reverse tone trench isolation resist layer 42B covering the alignment mark trench area 16 and the active areas 37 of the device area 14; the reverse tone trench isolation resist layer 42B is a reverse mask of the trench isolation resist layer 42A;

g) FIG. 4—using the reverse tone trench isolation resist layer 42B as an etch mask, etching the first dielectric layer 38 at least over the alignment mark area 18 in the substrate 10 there by removing the first dielectric layer 38 over the alignment marks 30; and removing the dielectric layer 38 over the active areas 37;

Note: One photoresist layer (42B) removes oxide 38 over both alignment marks 30 and active areas 37**.

h) FIG. 5—removing the reverse tone trench isolation resist layer 42B;

i) FIG. 6—chemical-mechanical polish the remaining first dielectric layer 38 thereby planarizing the first dielectric layer 38; and

* Note: The CMP is improved by the alignment area trench 34 (that lowers the height of large areas of oxide 38) and the Reverse tone photoresist mask 42B (that removes oxide over alignment marks 30 and active areas 37).

j) removing the polish stop layer 20 22.

BENEFITS OF THE INVENTION

The present invention provides many benefits over the prior art. The method removes oxide layers from over alignment marks using less optical masks than the prior art. That is a separate alignment mark clear out window mask and etch is not needed.

First, the invention uses a reverse tone trench isolation resist layer 42B to remove dielectric layer (e.g., oxide 38) from over the alignment marks 30 prior to the CMP process. The reverse tone photoresist mask 42B also removes oxide 38 over active areas 37 in the device areas 14. This reduces the STI trench oxide dishing problem in the device areas. The use of one optical layout (e.g., 42A and 42B) to define both the trench isolation resist layer 42A and the reverse tone trench isolation resist layer 42B reduces process costs.

Second, the invention's STI mask 42A forms the alignment area trench 34 and STI trenches 35 in the same step thus reducing costs. The alignment area trench 34 further reduces any remaining oxide 38 over the alignment marks 30 after the CMP process. The lack of a silicon nitride layer (22) and the dielectric layer 38 in the isolation trench 34 adjacent to the alignment marks 30 causes a locally enhanced polish rate which removes any remaining dielectric layer 38 over the alignment marks 30. The removal of the dielectric layer 38 over the alignment marks 30 makes the alignment marks more readable and distinct.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 is a cross-sectional view of a substrate with device areas 14, open areas 13, and alignment mark areas 18 according to the prior art.

FIGS. 2C, 3, 4, 5, and 6 are cross sectional views showing the process of the invention for forming alignment area trenches around alignment marks and using a reverse tone trench mask to remove oxide from alignment mark prior to a CMP process.

DETAILED DESCRIPTION OF THE PREFERRED EMBODIMENTS

The present invention will be described in detail with reference to the accompanying drawings. The present invention provides a method of forming a readable alignment marks on a wafer using a reverse tone photoresist etch mask 42B and a chemical-mechanical polish process.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not been described in detail in order to not unnecessarily obscure the present invention.

It should be recognized that many publication describe the details of common techniques used in the fabrication process of integrate circuit component. See, E.g., C. Y. Chang, S. M. Sez, in ULSI Technology, by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology, Future developments in the art may call for appropriate adjustments as would be obvious to one skilled in the art.

TABLE

Summary Of Major Steps In The Invention

Figure 4:
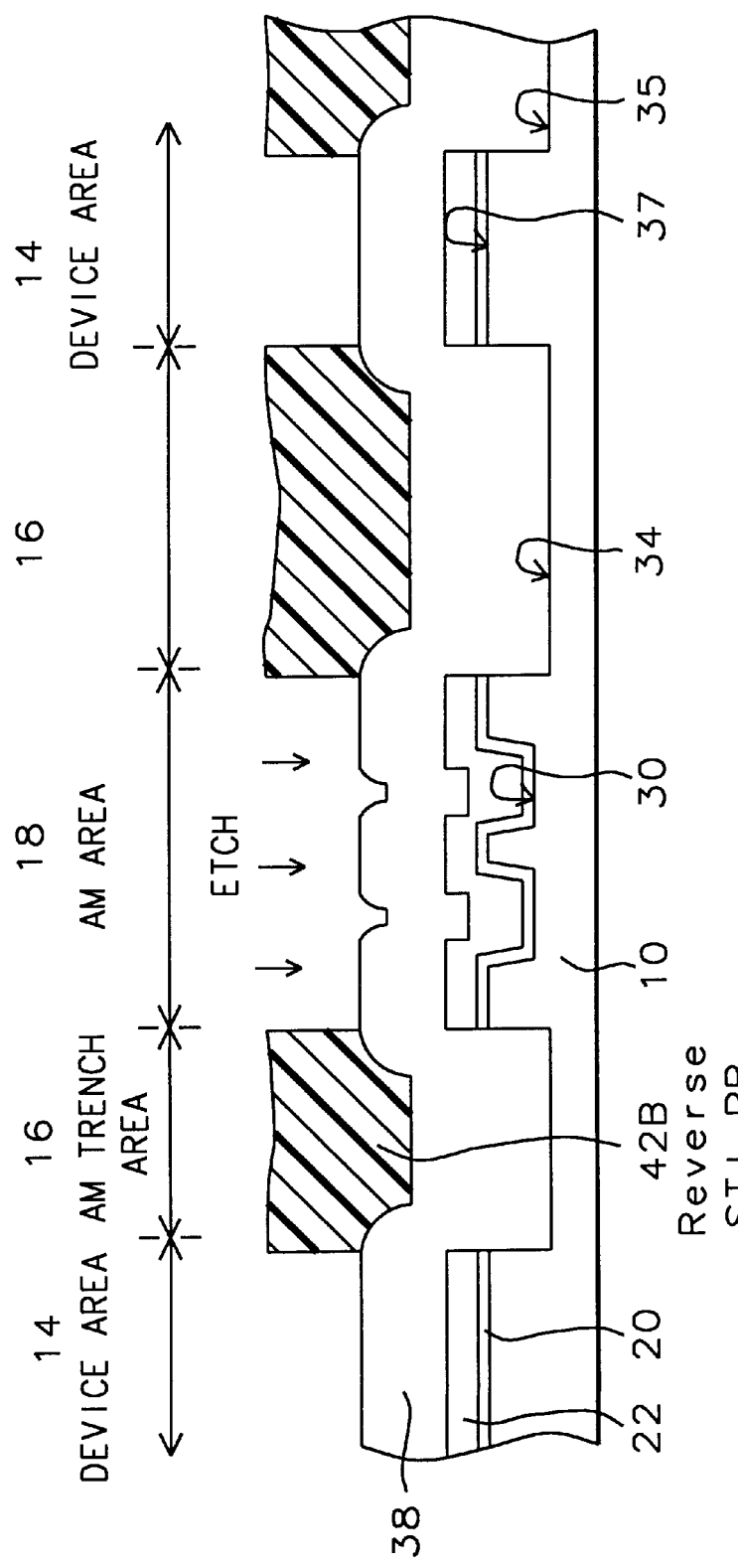
Figure 5:
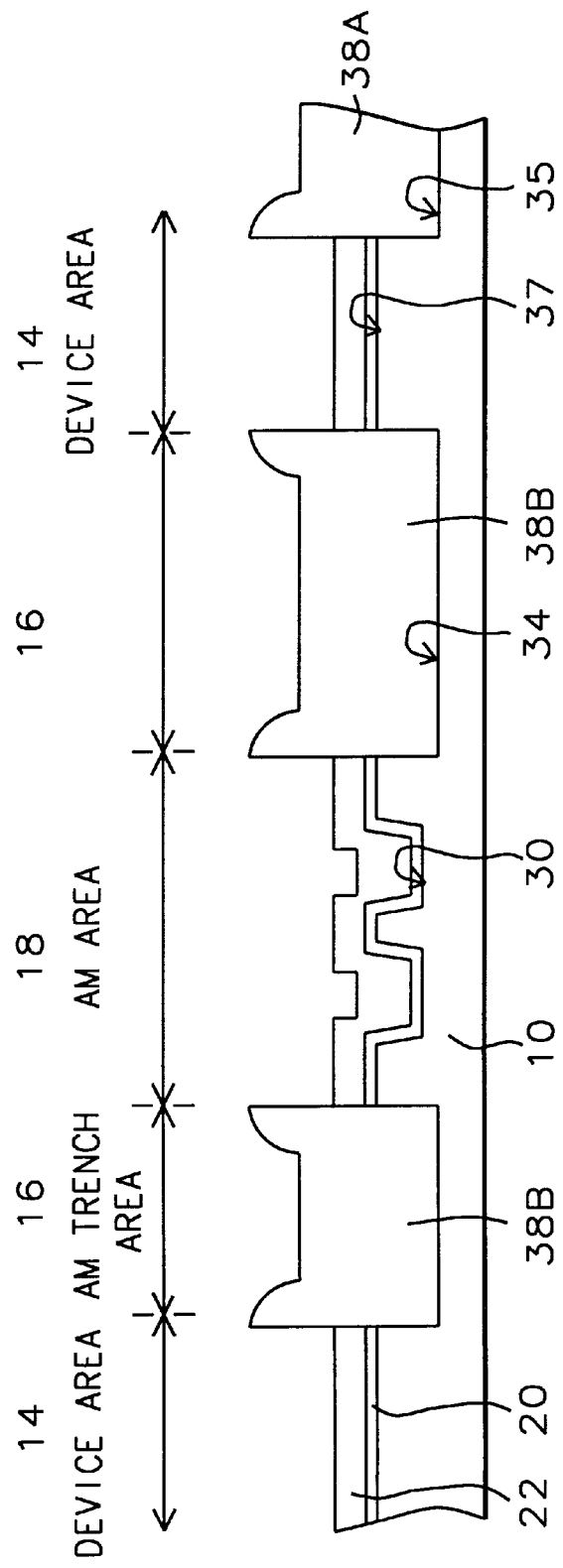
Figure 6:
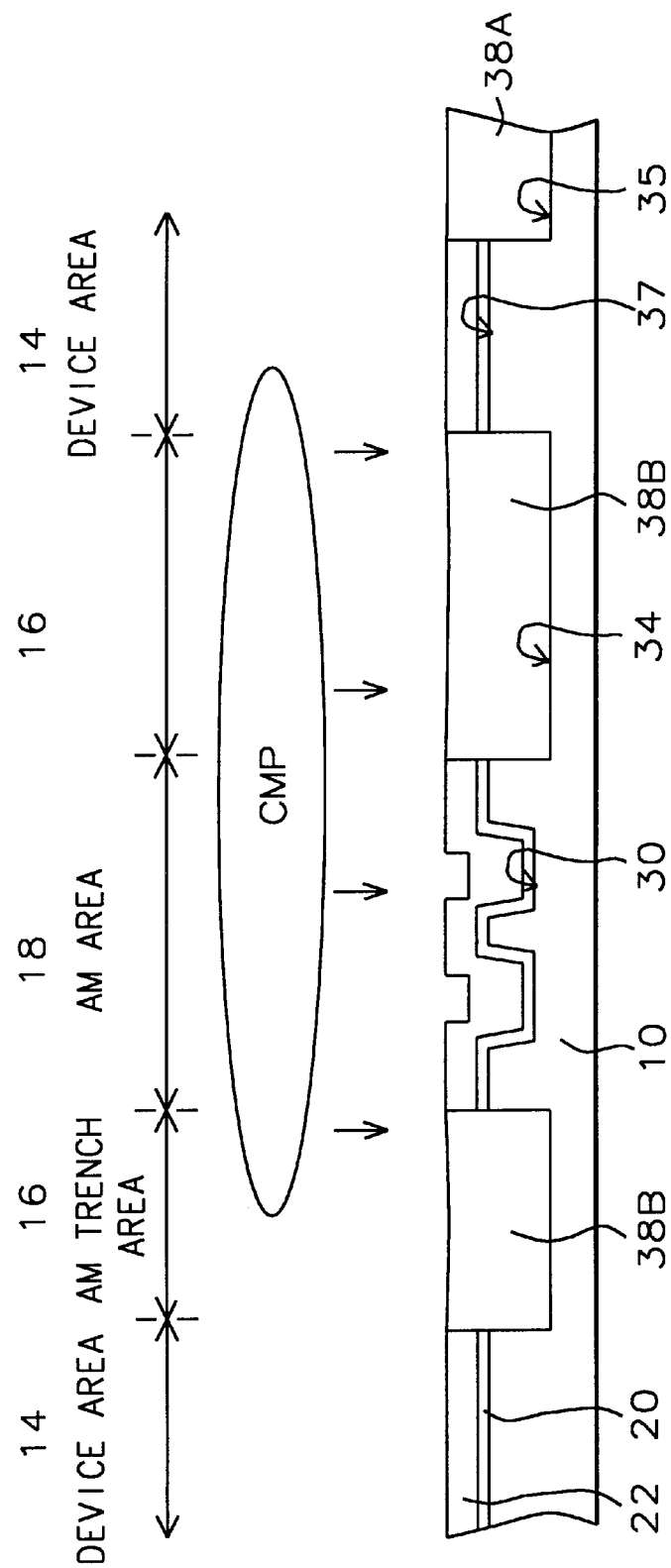

| | |
|---|---|
| FIG. 2C | forming alignment marks 30 in a substrate 10 forming a CMP polish stop layer 22 20 over the substrate 10 |
| FIG. 2c | Active area 37 (STI) patterning using a STI photoresist mask 42A to form alignment area trenches 34 around the alignment marks 30 (and STI trenches 35 in the device areas 14) |
| FIG. 3 | forming a first dielectric layer 38 over the substrate |
| FIG. 4 | forming a reverse STI photoresist layer 42B over the alignment area trenches 34; |
| FIG. 5 | Etching the exposed first dielectric layer 38 over at least the alignment marks 30 and active areas 37 |
| FIG. 5 | removing the reverse STI photoresist 42B; |
| FIG. 6 | chemical-mechanical polishing the remaining first dielectric layer 38 (STI CMP) over the AM trenches 34 and the STI trenches 35 in the device areas 14 |

The invention has two main elements:

(1) A STI photoresist mask 42A that is used to etch Alignment area trenches 34 around alignment marks 30 and to etch STI trenches 35 in device areas 14. (See FIG. 2C). The alignment area trenches 34 prevent over polishing of the alignment marks 30.

(2) A "reverse tone" STI photoresist mask 428 (See FIG. 4) that is used to remove the isolation oxide 38B from over the alignment mark 30 and from over the active areas 37. This removes all the oxide from over the alignment marks 30 making the alignment mark readable. This also improves the CMP planarization of the STI oxide 38A.

Figure 2A:
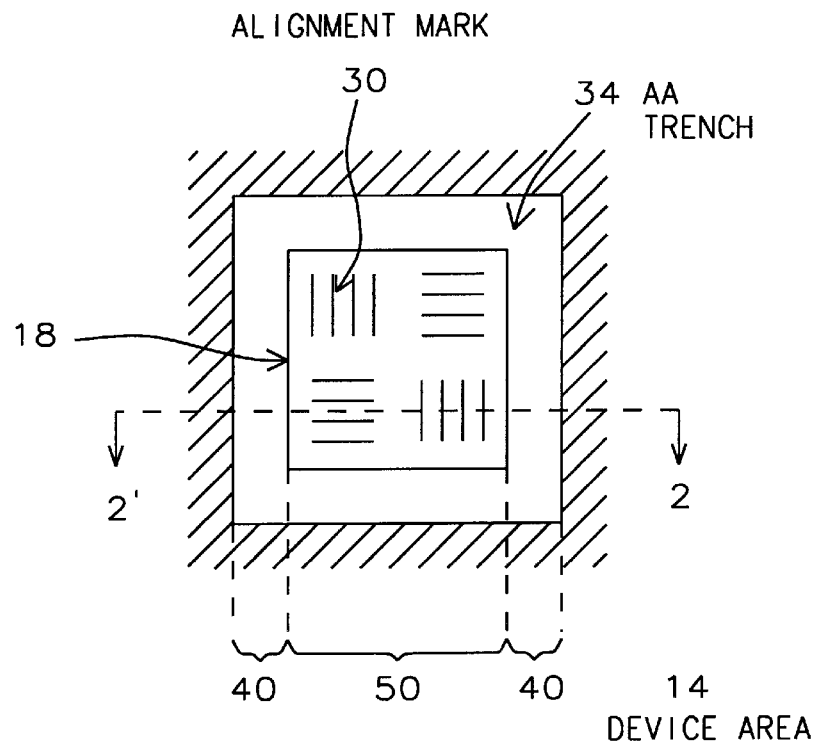
FIG. 2A is a top down view of the Alignment mark trench 34 and alignment mark area of the present invention.
Figure 2B:
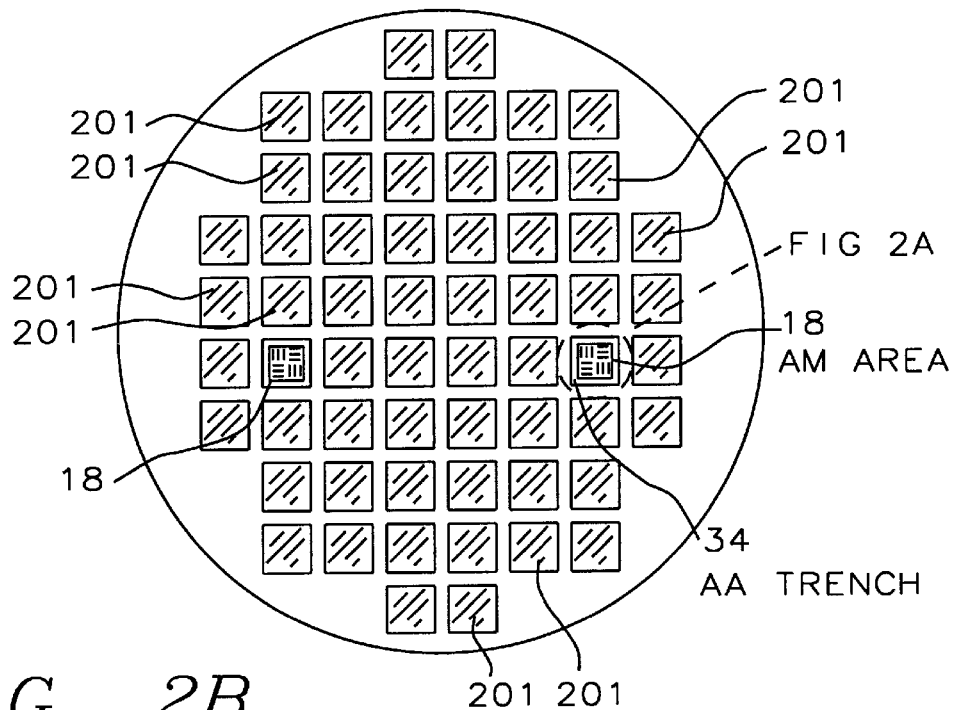
FIG. 2B is a top down view of a wafer having the alignment mark trench and alignment mark area 18 of the present invention.

As shown in FIGS. 2A, 2B and 2C, the method of the invention for removing a dielectric layer 38 from over alignment marks 30 begins by providing a substrate 10 having at least a device area 14 adjacent to a alignment mark trench area 16. The alignment mark trench area 16 is adjacent to an alignment mark area 18. Alignment marks 30 are formed in the alignment mark area 18. The device Area 14 has active areas 37 and shallow trench isolation (STI) areas 35.

FIG. 2B show a top down view of a wafer having two alignment marks areas 18 that are surrounded by the novel alignment area trenches 34. The circled area in FIG. 2b is shown in a close up view in FIG. 2A. FIG. 2B shows chips or dies 201 in the device areas 14. STI trenches 35 are later formed in the Device areas. The dies 201 surrounding the alignment mark areas 18 have a lower yield without using the method of the invention because pf the over polishing to remove the oxide 38 over area 13 around the alignment marks 30.

The alignment mark area 18 has alignment marks 30. The alignment marks 30 preferably have a depth in a range of between about 1500 and 2500 Å from the substrate surface and a spacing between adjacent alignment area trenches in a range of between about 6 and 10 µm. The alignment marks can be used to align ASM steppers.

The alignment marks 30 are typically formed before semiconductor devices are formed on the wafer. Typically two alignment mark areas 18 are on a wafer, However, often more are added for greater precision.

As shown in FIGS. 2C, 3 through 6, the alignment mark area 18 is surrounded by a novel alignment trench 34 (in the alignment mark (AM) trench area 34). Also, see FIGS. 2A & 2B. The alignment mark area 18 is preferably square shaped having a length/width 50 in a range of between about 0.5 and 2.0 mm and more preferably about 1.6 mm. The alignment mark tench 34 (and the alignment mark trench area 16) is preferably square shaped having a width 40 in a range of between about 0.8 and 2.0 mm, and more preferably about 0.95 mm. The overall width of the combined alignment area trench and alignment mark area (widths 40+50+ 40) is between about 3.0 mm and 4.0 mm and more preferably about 3.5 mm. FIG. 2A is a top plan view of the alignment mark area 18, and product area 14 where chips 201 are located (See FIG. 2B). FIGS. 2C, and 3 through 6 are cross sectional views along axis 2/2' in FIG. 2A.

Still referring to FIG. 2C, a polish stop layer 20 22 is formed over the substrate 10. The polish stop layer 20 22 is preferably comprised of a lower pad oxide layer 20 and an overlying stop layer 22. The lower pad oxide layer is preferably composed of a silicon oxide having a thickness in a range of between about 100 and 200 Å. The stop layer 22 is preferably composed of silicon nitride, or BN, and is more preferably composed of silicon nitride. The stop layer 22 preferably has a thickness in a range of between about 500 and 2000 Å.

Trench Isolation Resist Layer 42a Defines Novel Alignment Are Trenches 34

As shown in FIG. 2C, a trench isolation resist layer 42A is formed covering at least the alignment mark trench area 16 and active areas 37 of the device area 14 over the substrate 10. The shallow trench isolation (STI) photoresist layer 42A defines the Alignment area trench 34 and the isolation trenches 35 in the device areas 14. The trench isolation resist layer is preferably formed using an optical process using a positive photoresist, but can be formed by other photolithographic processes. The resist layer is preferably formed using an ASM stepper.

Still referring to FIG. 2C, using the trench isolation resist layer 42A (STI resist layer) as an etch mask, the polish stop layer 20 22 and the substrate 10 are etched forming alignment area trenches 34 in the alignment mark trench areas 16 in the substrate. In this same step the shallow trench isolation (STI) trenches 35 are formed in the devices areas 14. This way no extras masking steps are used to form the alignment area trench 34 and the STI trenches 35.

An important feature of the invention is that this process step can simultaneously form STI trenches 35 in the device areas 14 while forming the alignment area trenches 34 in the alignment mark trench area 18. This simultaneous STI trench formation in both the device area and the alignment mark trench area 16 eliminates extra masking and etch steps. The process of the invention is compatible with shallow trench isolation (STI) processes.

The alignment area trenches 34 (in the alignment mark trench area 16) preferably have a depth in a range of between about 3000 and 4000 Å. The alignment mark (AM) trenches 34 surround the alignment marks 30.

As shown in FIG. 3, a dielectric layer 38 is formed over the substrate and the polish stop layer 20 22. The dielectric layer 38 is preferably composed of silicon oxide. The dielectric layer 38 is preferably formed by a thermal process.

Reverse Tone Trench Isolation Resist Layer 42B

A critical step, as shown in FIG. 4, comprises forming a reverse tone trench isolation resist layer 42B covering the alignment mark trench area 16 and the active areas 37 in the devices areas. The reverse tone trench isolation resist layer 42B is the "reverse tone" of the trench isolation resist layer 42A—that is one resist layer covers the areas where the other resist layer has openings. The reverse tone resist layer can be formed using any of the conventional methods including using opposite type (positive and negative) photoresists with the same optical mask). The reverse tone resist layer can also be defined using an opposite type (e.g., mirror image) optical mask (that are used to expose the resist layers). Other Reverse tone photoresist processes are explained in "Silicon Processing for the VLSI Era, vol. 1", S. Wolf, Lattice Press 1986, pp. 418–423, & 477 which is incorporated herein by reference.

The preferred process to form the reverse tone trench isolation resist layer 42B is by using opposite type optical masks.

TABLE

Preferred photolithography process parameters for the Trench isolation photoresist 42A and the reverse Trench isolation photoresist 42B

|  | photoresist type | optical mask type (light field or dark field) |
|---|---|---|
| trench isolation PR 42A | positive | dark |
| reverse tone trench isolation PR 42B | positive | light |

The reverse trench photoresist 42B is preferably under exposed.

The reverse tone concept (e.g., PR layers 42A & 42B) is applicable to other photolithography technologies such as 1X optical mask (non-step) and Direct write lithography.

Etching The Oxide Layer 38 Over The Alignment Mark And Active Areas

As shown in FIGS. 4 & 5, using the reverse tone trench isolation resist layer 42B as an etch mask, the first dielectric layer 38 is etched at least over the alignment mark area 18. This removes the first dielectric layer 38 over the alignment marks 30.

At the same time, in the device areas 14, using the same reverse tone trench isolation resist layer 42B as an etch mask, the first dielectric layer 38 is etched at least over the active areas 37 (areas 37 of the substrate where STI trenches 35 are not formed). This removes the oxide 38 from over the active areas thereby improving the CMP process of the device areas. This reduces the trench dishing effect in the STI oxide 38A.

As shown in FIG. 5, the reverse tone trench isolation resist layer 42B is removed.

Turning to FIG. 6, the remaining first dielectric layer 38 is chemical-mechanical polished thereby planarizing the first dielectric layer 38 forming STI regions 38A in the device areas 14 (thus defining the active areas 37). Simultaneously, the dielectric layer 38B in the Alignment area trenches 34 is also planarized. The removal of the oxide layer 38 over the active area reduces the dishing effect in the trenches. Likewise, the lowering of the height of the oxide 38B in the alignment area trenches 34 allows the oxide 38B to be polished without over polishing in the trenches.

Subsequently, the polish step layer 20 22 is removed. Next, conductive and insulating layers are formed over the substrate to form semiconductor devices. Also, often metal layers are deposited over the alignment marks 30. The invention's removal of the oxide off the alignment mark 30 makes the alignment mark topology readable as subsequent layers are formed thereover. Also, it is important to remove the oxide 38 from the alignment marks 30 before layer are deposited thereover because it is harder to remove the oxide 38 after other layers are deposited thereover.

Benefits Of The Invention

The present invention provides many benefits over the prior art. The method removes oxide layers 38 from over alignment marks 30 with less optical masks than the prior art. First, the invention uses a reverse tone trench isolation resist layer 42B to remove dielectric layer (e.g., oxide 38) from over the alignment marks 30 prior to the CMP process. This same oxide removal step (and same reverse tone photoresist mask) can be used to remove oxide over active areas 37 (non-STI areas) in the device areas 14. This reduces the trench dishing problem in the product areas as well. The use of one optical pattern (dark and light field reverse optical masks) to define both the trench isolation resist layer 42A and the reverse tone trench isolation resist layer 42B reduces process costs. Furthermore, the masks 42A and 42B form the alignment area trench 34 and STI trenches 35 in the same steps thus reducing costs.

Second, the invention forms an alignment mark trench 34 around the alignment marks 34 using the same optical mask used to form STI trenches 35 in the device areas. This trench 34 further reduces any remaining oxide 38 over the alignment marks 30 after the CMP process. The lack of a silicon nitride layer (22) and the dielectric layer 38 in the isolation trench 34 adjacent to the alignment marks 30 causes a locally enhanced polish rate which removes more of the dielectric layer 38 over the alignment marks. The removal of the dielectric layer 38 over the alignment marks 34 makes the alignment marks more readable and distinct.

Difference Between the Invention and Alignment Mark "Window Masks"

In an unattractive method, the oxide layer 38B can be removed by a photo etch process called a "window mask". In the window mask process a separate photoresist layer is formed and the alignment marks are exposed and the entire rest of the wafer is covered. The metal layers over the alignment marks are etched away using the window mask as an etch barrier. This way the alignment marks are not covered by layers. Also, metal layer or other opaque layers can be formed over the alignment marks where the metal layers replicate the alignment mark topography. In contrast with the present invention's one PR layer (42B), the additional window photoresist layer and etch steps plus the attendant cleaning and inspections, undesirably increase cycle time and process complexity and also introduce particles and defects, resulting in an increase in cost and yield loss. Hence there is a need to provide a method of removing STI oxide layers 38B from over alignment marks 30 while at the same time eliminating the window mask and etch steps. The present invention addresses such a need.

While the invention has been particularly shown and described with reference to the preferred embodiments thereof, it will be understood by those skilled in the art that various changes in form and details may be made without departing from the spirit and scope of the invention.

What is claimed is:

1. A method of removing a dielectric layer from over alignment marks comprising the steps of:

a) providing a substrate having an alignment mark area having alignment marks; said alignment mark area surrounded and adjacent to a device area; said device area having active areas and shallow trench isolation (STI) areas;

b) forming a polish stop layer over said substrate;

c) forming a trench isolation resist layer on said polish stop layer covering at least said active areas in said device area; said trench isolation resist layer having openings defining said shallow trench isolation (STI) areas in said device areas;

d) using said trench isolation resist layer as an etch mask, etching said polish stop layer and said substrate forming shallow trench isolation (STI) trenches in said device area;

e) forming a dielectric layer over said substrate and said polish stop layer;

f) forming a reverse tone trench isolation resist layer on said dielectric layer; said reverse tone trench isolation resist layer having openings over said active area and said alignment marks; said reverse tone trench isolation resist layer is a reverse image of said trench isolation resist layer;

g) using said reverse tone trench isolation resist layer as an etch mask and etching said dielectric layer over said alignment marks thereby totally removing said first dielectric layer over said alignment marks; and totally removing said dielectric layer over said active areas;

h) removing said reverse tone trench isolation resist layer;

i) chemical-mechanical polish the remaining dielectric layer thereby planarizing said dielectric layer in said alignment area trenches and said shallow trench isolation (STI) trenches; and j) removing said polish stop layer.

2. The method of claim 1 wherein said alignment marks having a depth in a range of between about 1500 and 2500 Å and a spacing therebetween in a range of between about 6 and 10 µm.

3. The method of claim 1 wherein said alignment mark area having a width in a range of between about 0.5 and 2.0 mm and length in a range of between about 0.5 and 2.0 mm.

4. The method of claim 1 wherein said alignment marks are used for aligning optical steppers.

5. The method of claim 1 wherein said polish stop layer comprised of a lower pad oxide layer and an overlying stop layer; said lower pad oxide layer composed of a silicon oxide having a thickness in a range of between about 100 and 200 Å; and said stop layer composed of silicon nitride having a thickness in a range of between about 500 and 2000 Å.

6. The method of claim 1 wherein said dielectric layer is composed of silicon oxide; and said dielectric layer having a thickness in a range of between about 5000 and 7000 Å.

7. A method of removing a dielectric layer from over alignment marks comprising the steps of:

a) providing a substrate having an alignment mark area having alignment marks; said alignment mark area surrounded and adjacent to an alignment mark trench area; said alignment mark trench area surrounded by a device area; said device area having active areas and shallow trench isolation (STI) areas;

b) forming a polish stop layer over said substrate;

c) forming a trench isolation resist layer on said polish stop layer covering at least said alignment mark trench area and said active areas in said device area; said trench isolation resist layer having openings defining said alignment mark trench areas and shallow trench isolation (STI) areas in said device areas;

d) using said trench isolation resist layer as an etch mask, etching said polish stop layer and said substrate forming an alignment area trench in said alignment mark trench area in said substrate, and forming shallow trench isolation (STI) trenches in said device area;

e) forming a dielectric layer over said substrate and said polish stop layer;

f) forming a reverse tone trench isolation resist layer on said dielectric layer; said reverse tone trench isolation resist layer covering said alignment mark trench area and shallow trench isolation (STI) isolation areas and said reverse tone trench isolation resist layer having openings over said alignment marks and said active area; said reverse tone trench isolation resist layer is a reverse image of said trench isolation resist layer;

g) using said reverse tone trench isolation resist layer as an etch mask and etching said dielectric layer over said alignment marks thereby removing said first dielectric layer over said alignment marks; and removing said dielectric layer over said active area;

h) removing said reverse tone trench isolation resist layer;

i) chemical-mechanical polish the remaining dielectric layer thereby planarizing said dielectric layer over said alignment area trenches and said shallow trench isolation (STI) trenches; and j) removing said polish step layer.

8. The method of claim 1 wherein said alignment marks having a depth in a range of between about 1500 and 2500 Å and a spacing therebetween in a range of between about 6 and 10 µm.

9. The method of claim 1 wherein said alignment mark area having a width in a range of between about 0.5 and 2.0 mm and length in a range of between about 0.5 and 2.0 mm.

10. The method of claim 1 wherein said alignment marks are used for aligning optical steppers.

11. The method of claim 1 wherein said polish stop layer comprised of a lower pad oxide layer and an overlying stop layer; said lower pad oxide layer composed of a silicon oxide having a thickness in a range of between about 100 and 200 Å; and said stop layer composed of silicon nitride having a thickness in a range of between about 500 and 2000 Å.

12. The method of claim 1 wherein said alignment area trenches having a depth in a range of between about 3000 and 7000 Å; and a width in a range of between about 0.8 and 2.0 mm.

13. The method of claim 1 wherein said dielectric layer is composed of silicon oxide; and said dielectric layer having a thickness in a range of between about 5000 and 7000 Å.

14. A method of removing a dielectric layer from over alignment marks comprising the steps of:

a) providing a substrate having an alignment mark area having alignment marks; said alignment mark area surrounded and adjacent to an alignment mark trench area; said alignment mark trench area surrounded by a device area; said device area having active areas and shallow trench isolation (STI) areas;

b) forming a polish stop layer over said substrate;

c) forming a trench isolation resist layer on said polish stop layer covering at least said alignment mark trench area and said active areas in said device area; said trench isolation resist layer having openings defining said alignment mark trench areas and shallow trench isolation (STI) areas in said device areas;

d) using said trench isolation resist layer as an etch mask, etching said polish stop layer and said substrate forming an alignment area trench in said alignment mark trench area in said substrate, and forming shallow trench isolation (STI) trenches in said device area; said alignment area trenches having a depth in a range of between about 3000 and 7000 Å; and a width in a range of between about 0.8 and 2.0 mm;

e) forming a dielectric layer over said substrate and said polish stop layer;

f) forming a reverse tone trench isolation resist layer on said dielectric layer; said reverse tone trench isolation resist layer covering said alignment mark trench area and shallow trench isolation (STI) isolation areas and said reverse tone trench isolation resist layer having openings over said alignment marks and said active area; said reverse tone trench isolation resist layer is a reverse image of said trench isolation resist layer;

g) using said reverse tone trench isolation resist layer as an etch mask and etching said dielectric layer over said alignment marks thereby totally removing said first dielectric layer over said alignment marks; and totally removing said dielectric layer over said active area;

h) removing said reverse tone trench isolation resist layer;

i) chemical-mechanical polish the remaining dielectric layer thereby planarizing said dielectric layer over said alignment area trenches and said shallow trench isolation (STI) trenches; and j) removing said polish step layer.

* * * * *